United States Patent
Baecker et al.

(10) Patent No.: US 8,426,344 B2
(45) Date of Patent: Apr. 23, 2013

(54) METHOD FOR PRODUCING METAL SUBSTRATES FOR HTS COATING ARRANGEMENTS

(75) Inventors: Michael Baecker, Cologne (DE); Matina Falter, Swisstal-Buschhoven (DE); Jan Kunert, Rheinbach (DE)

(73) Assignee: Basf SE, Ludwigshafen (DE)

( * ) Notice: Subject to any disclaimer, the term of this patent is extended or adjusted under 35 U.S.C. 154(b) by 0 days.

(21) Appl. No.: 13/130,631

(22) PCT Filed: Nov. 24, 2009

(86) PCT No.: PCT/EP2009/065766
§ 371 (c)(1),
(2), (4) Date: May 23, 2011

(87) PCT Pub. No.: WO2010/058031
PCT Pub. Date: May 27, 2010

(65) Prior Publication Data
US 2011/0237441 A1    Sep. 29, 2011

(30) Foreign Application Priority Data

Nov. 24, 2008   (DE) .......................... 10 2008 058 768

(51) Int. Cl.
*H01L 39/24*    (2006.01)
(52) U.S. Cl.
USPC ........................................................ 505/410
(58) Field of Classification Search .................. 505/230, 505/237, 238, 430, 434, 445, 410; 428/699–702; 427/62, 532, 534, 540, 543
See application file for complete search history.

(56) References Cited

U.S. PATENT DOCUMENTS

2005/0016867 A1   1/2005   Kreiskott et al.
2005/0220986 A1   10/2005  Selvamanickam et al.

FOREIGN PATENT DOCUMENTS

EP    1653484 A1    5/2006
WO    2008/078852 A1  7/2008

OTHER PUBLICATIONS

Int'l Search Report and Written Opinion dated Feb. 25, 2010 in Int'l. Application No. PCT/EP2009/065776.
Int'l Preliminary Report on Patentability issued May 24, 2011 in Int'l Application No. PCT/EP2009/065766; Written Opinion.

*Primary Examiner* — Colleen Dunn
(74) *Attorney, Agent, or Firm* — Panitch Schwarze Belisario & Nadel LLP

(57) ABSTRACT

A method is proposed for producing a biaxially textured metal substrate having a metal surface, wherein the substrate is modified in order to produce a high-temperature superconductor coating arrangement and wherein the metal surface is modified in order to deposit a buffer layer or another intermediate layer epitaxially thereon and/or to deposit an oriented high-temperature superconductor (HTS) layer thereon. The method includes producing a biaxially textured metal substrate, subjecting the metal substrate surface to a polishing treatment, in particular an electropolishing treatment, and subjecting the metal substrate to a post-annealing after the surface polishing treatment and before a subsequent coating is performed involving epitaxial deposition of a layer of the HTS coating arrangement. This method results in smooth metal substrates with high textural overcoats and thereby improved HTS layers.

20 Claims, 5 Drawing Sheets

= 200μm; Map3; Step=3μm; Grid 251x121

4.0 μm

X: 20μm
Y: 20μm
Z: 80.2nm

X: 9.9μm
Y: 9.9μm
Z: 51.2nm

METHOD FOR PRODUCING METAL SUBSTRATES FOR HTS COATING ARRANGEMENTS

CROSS-REFERENCE TO RELATED APPLICATIONS

This application is a Section 371 of International Application No. PCT/EP2009/065766, filed Nov. 24, 2009, which was published in the German language on May 27, 2010, under International Publication No. WO 2010/058031, and the disclosure of which is incorporated herein by reference.

BACKGROUND OF THE INVENTION

The invention relates to a method for producing a biaxially textured metal substrate having a metal surface, which is modified for the production of a high-temperature superconductor (HTS) coating arrangement, wherein the metal surface is modified in order to deposit a layer of the HTS coating arrangement such as a buffer layer, another intermediate layer and/or an HTS layer epitaxially thereon. The invention also relates to a method for producing an HTS coating arrangement in which a buffer layer and/or another intermediate layer and/or a high-temperature superconductor layer are deposited epitaxially on the metal substrate.

In the production of high-temperature superconductor (HTS) coating arrangements, one or more buffer layers are deposited mostly epitaxially on a biaxially textured metal substrate, and a high-temperature superconductor (HTS) layer is deposited on the buffer layer(s). In this case, the buffer layer particularly serves as a diffusion barrier preventing a diffusion of metal atoms or impurities from the metal substrate into the HTS layer. Various deposition processes are known for this purpose, e.g., a vapor deposition of the components forming the buffer layer and/or the HTS layer, e.g., as MOCVD (metal-organic chemical vapor deposition), a chemical solution deposition in which the buffer and/or FITS coating materials are deposited using precursors, or physical processes, such as pulsed laser deposition (PLD), thermal co-evaporation (TCE), etc. Particularly in the chemical solution deposition, a texture transfer from the metal substrate to the HTS layer is required to enable a textured HTS layer to be produced. Correspondingly, if a buffer layer is used, a texture transfer from the metal substrate to the buffer layer and from this to the HTS layer is required.

The metal substrate is important for the properties of the HTS layer in a number of respects, particularly also as regards the achievement of high critical current densities and possibly also the sharpness of the superconducting transfer ($\Delta T_c$). The demands on the metal substrate are diverse. For instance, the metal substrate shall have a chemical purity which is as high as possible, a high degree of texturing and, if possible, a surface roughness which is as low as possible in order to enable the growth of a further layer of the HTS coating arrangement, e.g. a buffer layer or another intermediate layer. A roughness of the metal surface which is as low as possible is mostly desired in order to minimize misorientations in the growing layer of the HTS coating arrangement.

Decisive for the quality of the layers deposited on the metal substrate, especially also with regard to the critical current density of the HTS layer, is thus also the surface of the metal substrate, particularly its texture and roughness.

On the one hand, the method according to the invention shall enable the production of preferably optimum growth layers as, for example, buffer layers having a high texturing even on the industrial scale. But the production of metal substrates on the industrial scale is subject to limits, especially with regard to the surface quality which is a pre-requisite for an optimal texture transfer from the metal substrate to the growth layer. Accordingly, in an industrial production process, the biaxially textured metal substrate is mostly produced by a cold-forming process with a degree of deformation of $\geqq 95\%$ and involving a subsequent special annealing treatment. The cold-forming process is mostly performed using rollers. The degree of deformation is one of the decisive factors for the resulting degree of texturing and for the average angle of tilt of the individual crystallites against each other.

On the other hand, the metal substrates which are produced in this way exhibit a relatively high roughness. For various methods for the production of HTS coating arrangements, e.g. in the chemical vapor deposition, this is still acceptable. But especially in the deposition of layers of the HTS coating arrangement by chemical solution deposition, an insufficient texture transfer is observed in such metal substrates. However, increasing the roller nip, which might produce less wear of the rollers and smoother surfaces, would lead to a clearly worse texturing and to an increase in the angle of tilt on the metal substrate. Indeed, it is possible to produce metal substrates having an improved surface quality and enabling an increased texture transfer in the chemical solution deposition under laboratory conditions, for example by using highly polished rollers in the cold-forming process. However, such processes cannot be used on the industrial scale, because the lifetime of the rollers would not be long enough, so that these processes could no longer be carried out on an economical basis. If industrially produced biaxially textured metal substrates are used, only amorphous or only little-oriented growth layers of the respective materials of the HTS coating arrangement (e.g. of the buffer material) are achieved in the chemical solution deposition, despite the good texture of the metal substrate.

BRIEF SUMMARY OF THE INVENTION

It is therefore an object of the invention to provide a method for the production of biaxially textured metal substrates, which method can be used on an industrial scale and enables a high texture transfer to the layer of the HTS coating arrangement to be deposited on the metal substrate, especially with chemical solution deposition.

Surprisingly, this object can be achieved by a biaxially textured metal substrate being subjected to a polishing treatment and after this to a post-annealing treatment before a subsequent coating is performed involving epitaxial growth of a layer of the HTS coating arrangement.

Although it is known to reduce the roughness of metal surfaces by a polishing treatment, it turned out that such polished metal substrate surfaces of biaxially textured metal substrates do not allow the textured growth of a subsequent layer of the HTS coating arrangement. On the contrary, the growth layer is normally amorphous or its degree of texturing is insufficient with regard to the requirements, especially in the case of a chemical solution deposition process. However, extensive tests have surprisingly shown that metal substrate surfaces enabling a high texture transfer can be obtained by the metal substrate being subjected to a post-annealing treatment after the surface polishing treatment before a subsequent coating is or can be performed involving epitaxial deposition of a layer of the HTS coating arrangement. Although a surface of the biaxially textured metal substrate which is sufficiently smooth in itself can be obtained by the polishing treatment, a sufficient texture transfer to the directly following growth layer is obtainable only by a post-annealing treatment.

Without being bound by theory, it is assumed that by the polishing treatment the outermost atomic layers of the textured metal substrate are subject to a restructuring, for instance to an amorphization or to a partial oxidation which, however, is cancelled out at least partially or fully by the short-time post-annealing treatment, whereby at least a reorganization or re-crystallization of the metal substrate surface takes place, if necessary in connection with a reduction. In this case, the post-annealing treatment following after the polishing treatment can be normally performed over a shorter period than the re-crystallization post-annealing treatment at the production of the biaxially textured metal substrate after the cold-forming process, which can amount to approx 1 hour.

Accordingly, a biaxially textured metal substrate, which allows a very high texture transfer and thus a very high quality of the growth layer simultaneously with a very low roughness of the metal substrate surface and thus also a small number of grid defects and possibly a very low roughness of the surface of the growth layer facing away from the metal substrate, especially also in the chemical solution deposition, is obtainable only by the combination of the above-mentioned two treatment steps. This finally allows also the production of high-temperature superconductor layers of an improved quality, particularly with an increased texturing, a decreased surface roughness and/or an increased critical current density.

By the term "epitaxial growth" used herein is meant a crystallographically oriented growth, wherein referred to the substrate or growth plane, the crystal lattice of the growth layer can correspond to that of the metal substrate or also to a superstructure of the same. On the metal substrate a growth layer can be deposited whose crystal lattice can be arranged rotated or non-rotated with respect to the crystal lattice of the metal substrate. In a rotated growth of the growth layer, one or both of the crystallographic axes of the growth layer include an angle together with the crystallographic axes of the metal substrate in the growth plane (plane of the metal substrate surface). The or one of the lattice constant(s) of the growth layer can correspond to one or both of the crystallographic axes of the growth layer of the (110) or (210) axis of the metal substrate, possibly also to an integer multiple of the same, e.g. to two times or three times the same.

Here, the Z axis is respectively arranged transversely or vertically to the growth plane of the metal substrate. These data respectively relate to the crystal structure of the metal substrate, without considering the formation of a superstructure on the metal substrate surface, for instance by a post-annealing treatment. The growth layer which directly grows on the metal substrate can particularly crystallize cubically (e.g. fluoride type, pyrochlore type, $Mn_2O_3$ type), tetragonally (e.g. $La_2NiO_4$ type), orthorhombically (e.g. perovskite type) or rhombohedrally (e.g. perovskite type), possibly also monoclinically. Thus, the superstructure of the growth layer with respect to the metal substrate particularly is a metal substrate superstructure with respect to the growth plane. It turned out that, especially in growth layers growing in a rotated fashion, the method according to the invention results in a very clear improvement of the texture transfer from the metal substrate to the growth layer, especially if the metal substrate surface (uppermost atomic layer(s)) is formed by a superstructure of the metal substrate crystal structure. However, if need be, the method according to the invention can be advantageously used in growth layers which, with respect to the growth plane, do not form superstructures with the crystal lattice of the metal substrate and which correspond to the metal substrate lattice, except of a possible minor lattice mismatch.

The growth layer can be a buffer layer or another intermediate layer, which may possibly cover the metal substrate surface only partially, for instance an intermediate layer having crystallization positions for a buffer layer to be deposited. Possibly, the growth layer on the metal substrate can also directly be an HTS layer. The epitaxial growth layer produced on the metal substrate can generally be a metal oxide layer (if necessary after an annealing and crystallization treatment).

The method according to the invention can be terminated or interrupted at the method step of the post-annealing of the surface-polished metal substrate, so that the metal substrate thus produced is temporarily stored or coated with additional layers of the HTS coating arrangement at a different site. The deposition of the growth layer can also immediately follow the post-annealing treatment.

The polishing treatment can be generally performed in a batch or in a continuous operation. Also, the post-annealing treatment can be performed in a batch or in a continuous operation. Preferably, the polishing and the annealing treatments are performed in a continuous operation and preferably one immediately after the other.

If necessary, the polishing treatment can be performed as a mechanical polishing treatment or in any other suitable way.

Particularly preferably, the polishing treatment is performed as an electropolishing treatment. This enables, on the one hand, a particularly advantageous integration of the electropolishing step in the production process with the production of elongated, e.g. wire or tape-shaped metal substrates or HTS coating arrangements. It also turned out that due to the specialties of electropolishing, the polished surfaces of the biaxially textured metal substrates are particularly good for producing HTS coating arrangements, especially with regard to the required texture transfer from the metal substrate to the layers of the HTS coating arrangement to be grown.

Electropolishing can be performed using a direct current and possibly also pulsed currents. An electrochemical arrangement can be selected in which the metal substrate is connected as a medium conductor, i.e., lies at a so-called medium potential, particularly if the metal substrate to be polished is elongated, as for example wire or tape material. The current for the electrolysis is supplied to the rear side of the metal substrate, preferably over the entire rear side thereof, and if necessary the current can be supplied only over sections of the rear side which can be arranged so as to be distributed over the longitudinal extension of the substrate. Thus, the electropolishing cell is divided into two sub-cells. A particular advantage of this arrangement is that during electropolishing the current for the electrolysis need not flow through the very narrow tape cross section in the longitudinal direction of the substrate, which is the case, for example, if the current for the electrolysis is supplied to the tape to be polished through contacts like roller or sliding contacts, which are variable in their position with respect to the metal substrate (even though it is generally possible to implement the electropolishing step in this way). By the arrangement of the metal substrate as a medium potential conductor, high electropolishing currents can be realized, thus achieving particularly advantageous metal substrate surfaces as well as short dwell times and consequently higher throughput speeds in a continuous polishing process of the mostly wire or tape-shaped metal substrates.

Electropolishing can be performed at a current density of 2-80 $A/dm^2$ or possibly even higher, preferably at current densities of approx. 5-50 A/dm$^2$ or approx. 5-30 A/dm$^2$, particularly preferably at approx. 10-30 A/dm$^2$ or approx. 10-20 A/dm$^2$.

Electropolishing can be performed at an electrolyte temperature of 20-70° C., preferably 30-60° C., particularly preferably approx. 40-50° C.

Electropolishing can be performed for a period of $\leq$15 min or $\leq$6-10 min, preferably $\leq$3-4 min, particularly preferably within 1-2 min or less, referred in each case to the segment of the metal substrate to be electropolished. Preferably, electropolishing is performed over a period of $\geq$5 sec or $\geq$10-15 sec, $\geq$20-30 sec or $\geq$45 sec.

The electrolyte can contain sulfuric acid and/or phosphoric acid. The phosphoric acid can be orthophosphoric acid, a polyphosphoric acid, a metaphosphoric acid or a different phosphoric acid, including combinations thereof. The weight ratio of sulfuric acid/phosphoric acid (total of phosphoric acids) can be in a range of 1:20 to 20:1 or 1:10 to 10:1; from 1:6 to 6:1; from 1:4 to 4:1, preferably 1:3 to 3:1 or 1:2 to 2:1, e.g. in a range of approx 1:1. The electrolyte can have a pH of 1-4, preferably 2-3, possibly also a pH of <1.

Polishing and particularly electropolishing can also be performed in the presence of organic acids. If necessary, these can be used instead of or additionally to sulfuric acid and/or phosphoric acid. The organic acid can be a monovalent or multivalent carboxylic acid, for instance a $C_1$-$C_6$ or $C_2$-$C_4$ carboxylic acid, e.g. propionic acid. If necessary, even other organic acids can be used, e.g. sulfonic acids or a combination thereof. A preferred combination of inorganic and organic acids is a mixture of phosphoric acid, sulfuric acid and citric acid. If necessary, the electrolyte can contain additional complexing substances with respect to the metal ions or chelating agents, surface inhibitors, surfactants and other substances, which are dissolved from the metal substrate during electropolishing and which influence the electropolishing process.

It was found that the polishing and particularly the electropolishing treatment considerably improve not only the surface roughness of the metal substrate, which turned out to be beneficial to an optimal texture transfer. In addition, the metal substrate surface is freed from surface defects and organic and/or inorganic or other impurities as well as process aids or process aid residues, which would be disturbing in the growth of the next layer of the HTS coating arrangement and lead, for instance, to increased imperfections in the growth layer and to a worse texture transfer.

Process aids which are applied to the tapes during the industrial production process can particularly be rolling aids, such as rolling oils or soaps as well as separating agents, non-stick agents, like ceramic particles or coats.

It will be understood that prior to the polishing and particularly prior to the electropolishing treatment, the metal substrate surface can be subjected to a cleaning step. Cleaning can be performed using organic solvents, as for example alcohols, ketones and/or esters and the like, which are used in combination or one after the other, for example isopropanol and/or acetone. In particular, the metal substrate surface can also be slightly etched prior to the electropolishing treatment, especially using acids, such as organic acids. The same may be carboxylic acids, like $C_1$ to $C_6$ carboxylic acids, in particular $C_2$ to $C_4$ carboxylic acids and particularly preferably propionic acid. The carboxylic acids can also be multivalent, e.g. tartaric acid or citric acid. The treatment of the metal substrate can take place in each case in an ultrasonic bath.

Cleaning of the metal substrate surface prior to polishing, and particularly electropolishing, can also be performed by additionally or alternatively using surfactant-containing solutions, particularly aqueous surfactant solutions.

Surface cleaning of the metal substrate before polishing, and particularly electropolishing, can also be performed by plasma cleaning, particularly UV plasma cleaning.

The above-mentioned cleaning steps can also be performed in combination with each other in the described order or also in a different order.

Polishing can be performed up to a surface roughness of rms according to DIN EN ISO 4287 and 4288 of $\leq$15 nm, preferably $\leq$12-13 nm or $\leq$10 nm, particularly preferably $\leq$7-8 nm. The roughnesses respectively refer to an area of 10×10 µm within a grain boundary of a crystallite of the substrate surface, so that the grain boundaries of the metal substrate do not distort the specified roughness.

Surprisingly, as already mentioned above, it has been shown that the substrate surfaces obtained by polishing indeed exhibit a very low surface roughness which, in itself, is beneficial to the layer of the HTS coating arrangement to be grown. Nevertheless, these supposedly optimal metal substrates produced growth layers with a completely inadequate texture transfer. For instance, the growth layers deposited on such a polished substrate merely exhibited a very poor texture or they were practically amorphous. The same also applies to lanthane zirconate layers, as obtained for example according to German published patent application DE 10 2004 041 051 A1 or in a different suitable way, or to other buffer layers, as for example cerium oxide. This negative result was discovered although the EBSD (electron back scattering diffraction) analyses of the polished substrates had shown results similar to those of unpolished substrates. However, any epitaxial growth could still not be observed.

Surprisingly, however, a very good texture transfer from the polished metal surface to the oxidic growth layer of the HTS coating arrangement could be observed, if the metal substrate is subjected to post-annealing after surface polishing and before the deposition of another layer. Post-annealing can be performed in particular at a suitable temperature and over a sufficient period of time, so that a partial or preferably at least practically complete re-crystallization of the metal substrate surface takes place. This re-crystallization preferably involves the uppermost atomic layers of the metal substrate so that, for instance, a re-crystallization within a surface layer can be observed starting from the metal substrate surface with a depth of 2-3 nm, preferably a depth of 1.5-1 nm or particularly preferably a depth of 0.1-0.5 nm. Particularly preferably, a re-crystallization of the uppermost atomic layers of the metal substrate, e.g. a re-crystallization within the upper 10-15 atomic layers, preferably within the upper 5-8 atomic layers or less, thus takes place through the post-annealing process. The crystallization of these uppermost atomic layers can be detected particularly by RHEED measurements (reflective high electron energy diffraction), which contrary to EBSD analyses allow a characterization of the uppermost atomic layers of the metal substrate. Accordingly, it turned out to be decisive that after the polishing of the biaxially textured metal substrate, a re-crystallization of the uppermost metal layers of the substrate takes place in order to guarantee epitaxial growth of the next layer of the HTS coating arrangement at a high texture transfer.

Generally and particularly also in the case of nickel and/or copper-base alloys, the post-annealing can be performed at a temperature of $\geq$650° C.-700° C., preferably at temperatures of $\geq$750° C.-800° C., particularly preferably at temperatures of $\geq$800° C.-850° C., $\geq$900° C.-950° C. or $\geq$1000° C. The post-annealing should not be performed at excessively high temperatures in order to avoid a negative influence on the texture of the metal substrate. Accordingly, the post-annealing can be performed at temperatures of ≦1300° C.-1350° C., particularly ≦1200° C.-1250° C., preferably at temperatures of ≦1150° C.-1100° C., which particularly applies to nickel and/or copper-base alloys.

The post-annealing can be generally performed in a temperature range which is lower than the melting point of the respective material of the metal substrate (congruent or incongruent melting point), for instance including but not limited to a temperature range 50-700° C. lower, particularly in a temperature range 100-600° C. or 200-550° C. lower than the melting point of the metal substrate.

By the targeted orientation annealing of the uppermost atomic layers of the metal substrate according to the invention, the same can be again oriented and textured like the deeper layers of the metal substrate or, with respect to the crystal structure of the metal substrate, crystallize in a superstructure thereof, for example in a cubic or orthorhombic superstructure, particularly sulfur superstructure (e.g., an atomic arrangement corresponding to one half monolayer of sulfur (or of the corresponding metal atom having a c(2×2) superstructure).

It turned out that if the temperatures are sufficiently high, post-annealing is required only over a very short period, for example over a period of ≦12-15 min or ≦8-10 min, for example also ≦4-6 min or ≦2-3 min, in each case referred to the holding period at the highest temperature or referred to the total dwell time at temperatures of ≧650° C.-700° C., ≧750° C.-800° C. or preferably ≧800° C.-850° C., ≧900° C.-950° C. or particularly preferably ≧1000° C. It will be understood that the necessary post-annealing time can substantially depend on the post-annealing temperature, which depends on the respective metal substrate and thus on the melting point or the mobility of the atoms of the uppermost metal layers of the substrate.

At the post-annealing treatment which follows the polishing treatment, an inert and preferably reducing atmosphere can be employed, the hydrogen partial pressure can correspond to a hydrogen content of the atmosphere of ≧10-24% by volume or ≧50-75% by volume, preferably ≧85-90% by volume or ≧95-98% by volume and can be, for instance, pure hydrogen. The remaining components can be nitrogen or preferably noble gases, such as argon or helium.

Accordingly, the post-annealing can be particularly performed in such a manner that, if analyzed by way of RHEED, the surface is at least partially crystalline or, according to the applied analyzing method, at least practically completely crystalline. The RHEED measurements can be performed in such a manner that the information depth predominantly or practically exclusively involves the uppermost 2-4 or 4-5 or the uppermost 6-8 or 19 atomic layers.

The metal substrate can particularly be a nickel and/or copper-base alloy which can each contain additional alloying elements. Nickel-base alloys can particularly contain tungsten as an alloying element, for instance up to 14-25 atomic percent referred to the total metal content of the alloy or up to 5-9 atomic percent of tungsten. The alloys can each contain alloying elements and/or additives which facilitate industrial production, e.g. the conversion of the substrates (for instance magnesium, aluminum, boron) or influence the texture formation, as for example other metals of the first transition metal period, particularly manganese and/or silver or rare earth elements, particularly cerium. The metal substrate can also represent a copper-base alloy, for instance constantan, Hastelloy or the like. What has been mentioned above can also be true for these latter alloys.

A buffer layer can be deposited on the metal substrate epitaxially, wherein the metal substrate, if necessary, can be provided with an intermediate layer, which does not cover the metal substrate throughout and which can be designed in the form of a plurality of crystallization germs for the buffer layer to be deposited.

The buffer layer can especially be a metal oxide, as for example a rare earth transition metal oxide, like rare earth zirconates (SE including lanthane), e.g. gadolinium zirconate, lanthane zirconate, manganates such as lanthane magnanates, ruthenates such as strontium ruthenate, rare earth aluminates including lanthane aluminate; rare earth metal Ce oxides, wherein lanthane can be contained as a rare earth metal, in particular according to German published patent application DE 10 2008 016 257 A1, the full disclosure of which is incorporated herein by reference, as well as other rare earth metal oxides, as for example neodymium gadolinium oxide (e.g. $NdGaO_3$); main group metal-transition metal oxides such as strontium ruthenate, strontium zirconate, calcium strontium titanate, barium calcium (strontium) titanate (or generally mixed alkaline earth metal titanates comprising 2 or 3 alkaline earth metals from the group of Ca, Sr, Ba or Mg, Ca, Sr, Ba, as for example $EA1_xEA2_{1-x}TiO_3$ with $0<x<1$ or generally (EA1, EA2, EA3)$TiO_3$ with EA=alkaline earth metal), wherein titanium in the alkaline earth metal compounds can be fully or partially substituted by one or more other transition metals, particularly transition metals of the first transition metal period); binary metal oxides, preferably of main group or transition metals, such as magnesium oxide, yttrium oxide, zirconium oxide, nickel oxide, titanium dioxide, yttrium-stabilized zirconium oxide (YSZ), cerium oxide, or other oxides, such as LSMO (lanthane strontium manganate), NdBaCuO (neodymium barium cuprate) or the like, gadolinium oxide (e.g. $Gd_2O_3$), europium oxide (e.g. $Eu_2O_3$), samarium oxide (e.g. $Sm_2O_3$), neodymium oxide (e.g. $Nd_2O_3$), etc. The oxides can also be non-stoichiometric, particularly substoichimetric, with respect to the oxygen content and/or metal content. With regard to the lattice of the metal part of these oxides, also mixed crystal phases on the basis of the above-mentioned oxides can be present respectively, both by mixed atomic layers, superstructures or interstitial metal atoms.

The buffer layer materials can contain transition metals, particularly of the first transition metal group, or metals or metal oxides, which at temperatures of ≦1600° C. form an at least partial melt with the oxidic buffer material. In this respect, reference is made to German published patent application DE 10 2008 016 258 A1, the full disclosure of which is incorporated herein by reference. If necessary, the growth layer can also consist of other oxides whose crystal lattice corresponds to that of the metal substrate, as for example in the case of a substrate having a nickel structure (also alloy) strontium titanate ($SrTiO_3$), barium titanate ($BaTiO_3$), titanium nitride (TiN) or the like.

The metal substrate in the above-mentioned buffer materials can particularly be Ni or Cu or a Ni alloy or a Cu alloy, which can each contain particularly W and/or Mo and/or at least one additional transition metal. The content of W and/or Mo and/or of the at least one additional transition metal (e.g. Fe, Cr and/or Mn) can amount to ≧0.05% to 0.1% or ≧0.2% to 0.5% or ≧1%, the content can each amount to ≦20% to 25% or ≦15% to 17% or ≦10% to 12% (each in atomic percent referred to the total alloy).

Generally, the method according to the invention can be used preferably if the buffer material layer includes a lattice mismatch with respect to the metal substrate on which the buffer layer material grows and/or possibly with respect to the layer (e.g. HTS layer) which grows epitaxially on the buffer material layer. The lattice mismatch here respectively refers to the relationship of the lattice constants of the metal substrates or of the next layer growing on the buffer layer with respect to the scaled lattice constant of the buffer layer, i.e., scaled to a unit cell of the adjacent layer. As a lattice constant of the metal substrate, the lattice constant of the bulk material (volume material without consideration of a superstructure of the uppermost atomic layer(s)) can be assumed or possibly with consideration of a possible superstructure (e.g. sulfur superstructure) of the uppermost atomic layer.

Here, the lattice mismatch can respectively amount to $\leq\pm20$-15%, preferably $\leq\pm10$-12% or $\leq\pm6$-8%, the lattice mismatch can respectively amount to $\geq\pm0.5$-1%, $\geq\pm2$-4% or also $\geq5\%$ (in the case of $La_2Zr_2O_7$ with $a_0$ (300° K)=10.8 Å, the result with respect to Ni ($a_0$=3.52 Å, 300° K) accordingly is a scaled lattice constant $L_m$ of 3.81 Å and thus a lattice mismatch of 7.61%). With the method according to the invention, a particularly good texture transfer and minor growth defects of the buffer layer are achievable even in the case of the rotated growth of the buffer layer and a lattice mismatch.

Is was found out that the metal substrate produced in accordance with the present invention allows, especially in the chemical solution deposition process involving a buffer layer or other intermediate layer, a very high texture transfer and hence an epitaxial growth of the buffer layer with as few defects as possible. The chemical solution deposition can be performed using particularly salts of carboxylic acid (particularly propionates and/or pivalinates) of the respective metals, wherein the salts of the carboxylic acid can be partially or fully fluorinated, for example in the form of trifluoroacetates. Metal salts (with respect to the metals to be deposited) of non-fluorinated, partially or fully fluorinated carboxylic acids can be used successively or simultaneously in the deposition steps. In this respect, reference is made to German Patent DE 10 2004 038 030 B4 (particularly example 1), U.S. Pat. No. 5,656,382, and example 3 of German published patent application DE 10 2044 041 053 A1, the full disclosures of which being incorporated herein by reference. Where appropriate, however, the chemical solution deposition can be performed in a different suitable way. Generally in the chemical solution deposition, suitable precursors (e.g. suitable metal complexes) from a suitable solution, e.g. an aqueous solution, are applied to the substrate, dried and thereafter pyrolized (preferably involving the formation of oxides) and crystallized, wherein drying, pyrolysis and crystallization can possibly take place simultaneously or also one immediately after the other.

The metal oxide layers of the HTS coating arrangement deposited on the metal substrate can correspond in their EBSD analyses almost to those of the metal substrates, while a slight deterioration of the indexing rate of $\leq5$-7% or $\leq3$-4% may exist. The indexing rate of the metal substrate can be $\geq93$-94% or $\geq95$-96% or $\geq97$-98%.

The invention thus also comprises a method for producing an HTS coating arrangement in which a buffer layer and/or a different intermediate layer and/or a high-temperature superconductor layer is deposited epitaxially on a biaxially textured metal substrate produced in accordance with the invention. If necessary, the high-temperature superconductor layer can be directly deposited on the metal substrate surface, preferably on a buffer layer that can be deposited directly on the metal substrate according to the invention or on a further buffer layer, so that the buffer layer can also consist of a succession of several layers. The invention further relates to an HTS coating arrangement in which a buffer layer and/or a different intermediate layer and/or a high-temperature superconductor layer is directly, i.e. immediately, or indirectly, i.e. with the arrangement of a (further) intermediate layer, deposited epitaxially on a biaxially textured substrate produced using the method according to the invention. The coating arrangement can respectively comprise an HTS coating arrangement or can be adapted for the epitaxial deposition of such a layer or cannot yet comprise an HTS layer.

The high-temperature superconductor can particularly be an YBCO material (Y—Ba—Cu—O) or a SEBCO material (Se—Ba—Cu—O), a BiSr material (Bi—Sr—Ca—Cu—O) or also a different HTS material. In the present case, a high-temperature superconductor is meant to be one having a transition temperature of $\geq77°$ Kelvin.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

The production of the metal substrate according to the invention for a high-temperature coating arrangement is based on an industrially produced biaxially textured metal substrate, for instance in the form of a tape or wire.

The substrate according to the embodiment comprises a nickel alloy containing 14% by weight of tungsten and 100 ppm of magnesium. The material was melted in a vacuum furnace and subsequently subjected to hot rolling, for instance down to a thickness of 5 mm or 3 mm, and then subjected to cold rolling, preferably involving a reduction of the thickness of the material with a reduction degree of 5-40% or 10-30%, particularly with a reduction degree of approx. 20%, so that based on the above-mentioned material, the thickness of the material can amount to approx. 80 μm or approx. 60 μm. Here, the reduction degree corresponds to the conversion degree in the direction of the sheet thickness. Cold forming thus amounted to $\geq95\%$ by volume. The tape thus obtained can be cut to the desired width using a cutting roller. The material obtained in this manner was subjected to an annealing treatment at a temperature above 700° C.-800° C., specifically in a range of 850° C.-1100° C., for a duration sufficient for re-crystallization, e.g. 1 hour or longer.

In this way, highly textured metal substrates are achieved in which the medium angle of tilt of the crystallites against each other can amount to ≦4-5°. An ESBD-analytical image of such a substrate surface is shown in FIG. 1.

Figure 1:
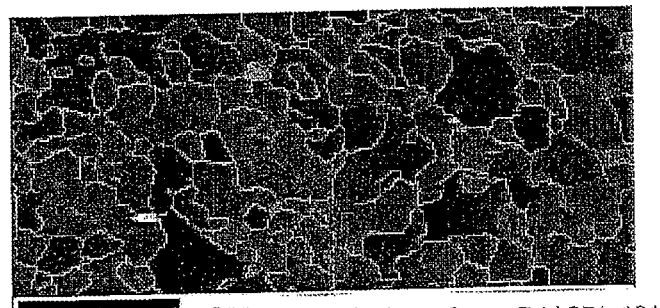
FIG. 1 is a surface structure map according to an EBSD analysis of a metal substrate with a texture diagram.
Figure 1:
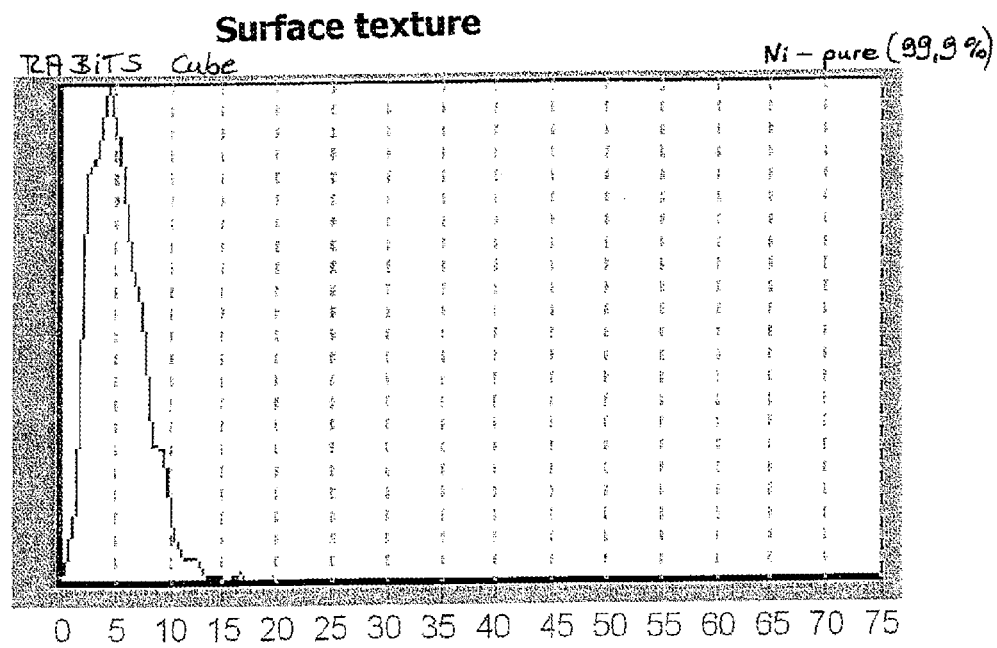
Figure 2:
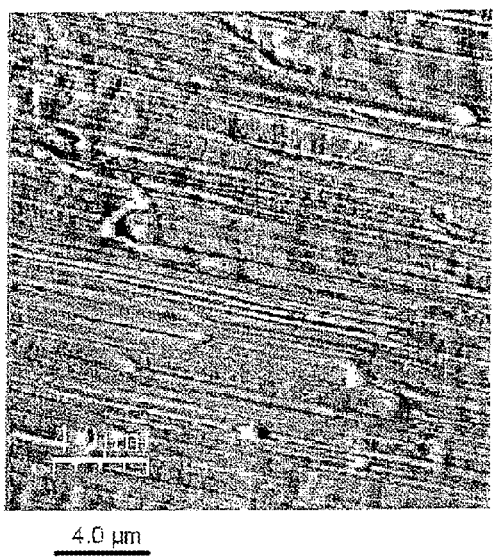
FIG. 2 is an AFM measurement of the surface profile of a metal substrate (left) with 3D (perspective) representation (right) of an embodiment according to the present invention.
Figure 2:
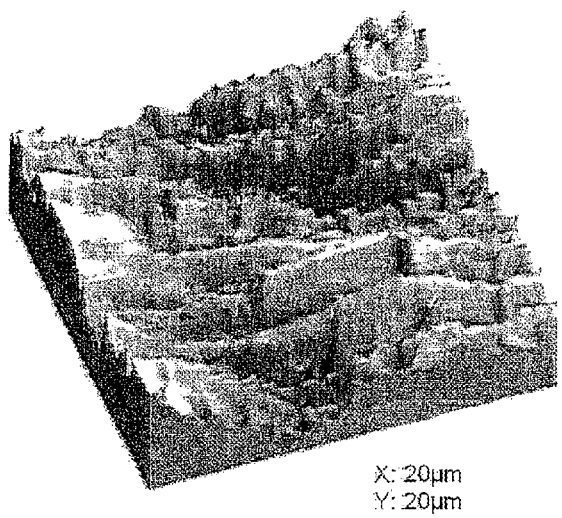

FIG. 2 shows an AFM (atomic force microscopy) image and a surface profile respectively of such an industrially produced biaxially textured metal tape according to FIG. 1, in which a plurality of deep scratches or roller traces can be noticed on the metal substrate surface. The roughness after rolling was determined to be rms of approx. 19 nm, using an atomic force microscope (AFM), the measuring area was 20×20 μm.

However, it turned out that buffer layers deposited on metal substrate surfaces according to FIG. 2, particularly using the chemical solution deposition, produced only amorphous or little-oriented layers. For example, FIG. 3, Curve 1 shows an X-ray diffraction pattern of a lanthane zirconate buffer layer deposited on a metal substrate surface according to FIG. 1 and produced in accordance with example 1 of DE 10 2004 038 030 B4 or in accordance with example 3 (page 7) of DE 10 2004 041 053 A1.

According to invention, the above-described metal substrates shown in the FIGS. 1 and 2 were used with their surface structure as illustrated in the example, for the production of biaxially textured metal substrates, which are suitable for epitaxial growth of buffer layers and other layers for the production of a high-temperature superconductor coating arrangement.

The substrate surface was first subjected to cleaning, which, however, is not absolutely necessary under certain circumstances. Cleaning can be performed in the form of ultrasonic cleaning, using for instance solvents, in particular organic solvents such as alcohols, ketones, organic acids, particularly carboxylic acids, such as propionic acid and the like. Alternatively or additionally, physical cleaning techniques, such as UV plasma cleaning, can also be performed.

After the possible cleaning step, the metal substrate is subjected to polishing and, according to the embodiment, to electrochemical polishing.

Electropolishing can be performed in an acidic polishing bath. The polishing bath can contain one or more acids selected from the group of sulfuric acid, phosphoric acid, organic acids, particularly carboxylic acids. In the present case, the polishing bath consisted of the main components sulfuric acid/orthophosphoric acid (electrolyte E260 from the company Poligrat GmbH, Munich, Germany). Comparable results were obtained using electrolytes based exclusively on organic acids, e.g. the electrolyte E520 from Poligrat.

Figure 5:
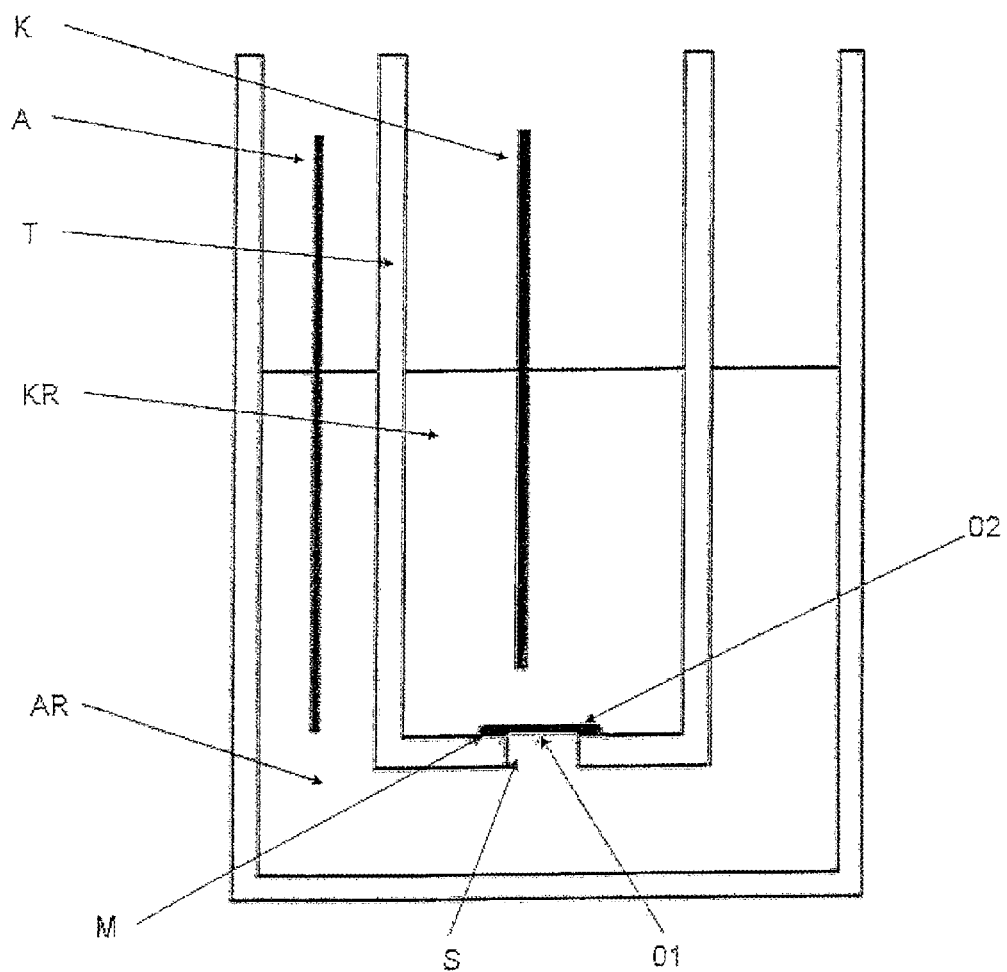
FIG. 5 is a schematic illustration of an electropolishing cell having two sub cells and the arrangement of the metal substrate at medium potential according to the present invention.

The polishing bath can be composed as illustrated in FIG. 5. The cathode compartment KR (sub cell 1) including the cathode K can be separated from the anode compartment AR (sub cell 2) including the anode A by a partition T. The partition can have a gap S, which can be closed by the metal substrate M to be polished, in the present case a metal tape. The metal substrate thus separates the anode and cathode compartments, preferably at least substantially in a liquid-tight fashion, with one upper side 01 of the metal substrate being disposed in the anode compartment and the other or opposite upper side 02 of the metal substrate being disposed in the cathode compartment. Accordingly, the electrolysis current penetrates the metal tape, particularly the metal substrate upper side to be polished in the anode compartment.

Two samples of a material obtained in this way were re-crystallized using different processes.

Sample A:

Annealing of 1 m sample under 100% hydrogen for one hour at 1000° C. inside a laboratory tube furnace in batch mode.

Sample B:

Annealing of 10 m inside a continuous tube furnace at a throughput speed of 2 m/hr and a dwell time of one hour at 1050° C. and under a reducing atmosphere, e.g. 100% hydrogen.

Sample C:

For improving the handling and for preventing sticking of materials at high temperatures, a 100 m long tape was coated with a suspension of MgO particles of a size of d50≈5 μm. Thereafter, the tape was processed as in sample B.

Both samples A and B exhibited very good EBSD (electron back scattering diffraction) results. In both samples, the percentage of the measuring points (MP) within 10% misorientation was higher than 99%, the percentage MP within 5% misorientation was higher than 80%. The indexing degree of both samples was >95%.

The subsequent deposition of buffer layers of lanthane zirconate ($La_2Zr_2O_{7\pm x}$) on the metal substrate treated in this manner was performed by way of chemical solution deposition, for example using an immersion process. The coating was performed in each case as a standard coating. As a coating solution, lanthane(III)propionate and zirconium(IV)propionate, each in a 0.4 molar solution in propionic acid, were used. Alternatively and if necessary, a solution of lanthane (III)pentandionate and zirconium(IV)pentandionate can also be used, each in a solution in acetyl acetone, for example each in a 0.2 molar solution, with respect to $La_2Zr_2O_7$.

Thereafter, drying took place applying an increased temperature for a sufficient period, for example at temperatures within a range of 100-500° C., for example 100-350° C. or at approx 150-200° C. Drying (without disintegration) took place in the presence of air. After drying, a crystallization of the buffer layer material was performed, for example at 1000-1050° C. under reducing conditions, e.g. under forming gas (1-5% by volume of $H_2$ in $N_2$). The crystallization time was 45 min.

Generally, the coating can also be performed according to example 1 (page 6) of DE 10 2004 038 030 B4 or example 3 of DE 10 2004 041 053 A1.

The coating and annealing processes were performed either on short samples (10 cm) or continuously on tapes of up to 10 m length. The results were comparable in both processes.

Figure 3:
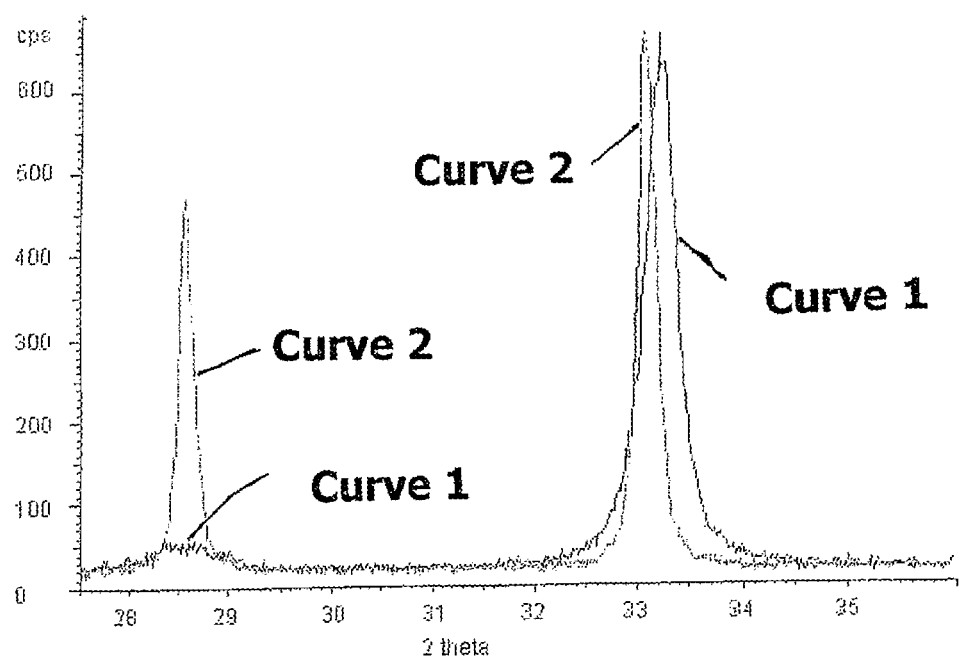
FIG. 3 is a graphical representation of X-ray diffraction patterns of lanthane zirconate buffer layers on a metal substrate according to FIG. 1 after electropolishing with annealing (Curve 1) and without surface annealing (Curve 2)
Figure 4:
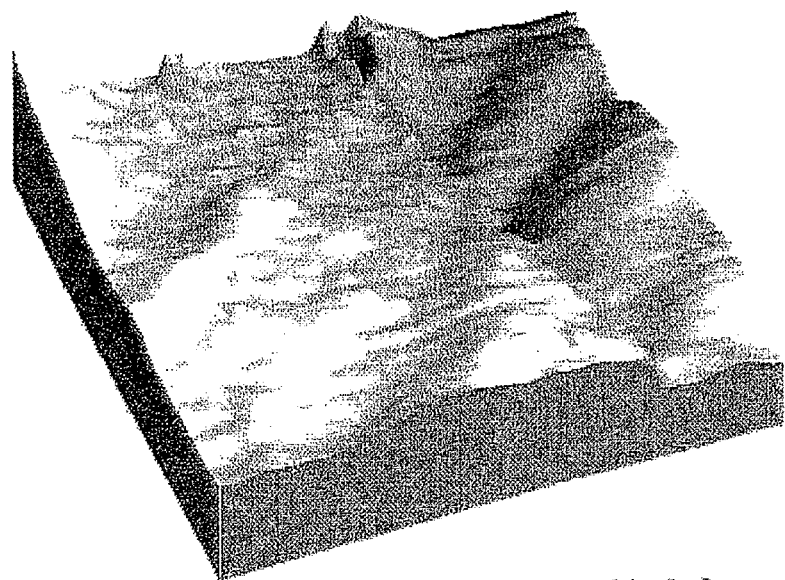
FIG. 4 is perspective representation of an AFM measurement of the surface profile of a metal substrate according to FIG. 1 after polishing in accordance with the invention.

The lanthane zirconate buffer layers obtained in this way were oriented or textured in none of the two samples (X-ray diffraction patterns corresponding to FIG. 3, Curve 1 were obtained).

Due to the coating with MgO, sample C could not be reasonably analyzed and coated.

Thereafter, the above-described samples A, B and C were alternatively subjected to a method according to the invention.

First, both samples A and B were cleaned in an ultrasonic bath, using for instance organic solvents, such as isopropanol, acetone or the like. According to the embodiment, cleaning was performed using isopropanol first and acetone thereafter. The dwell time in the ultrasonic bath in each case was approx 5 min. A further sample C was slightly etched in the ultrasonic bath using an organic acid, e.g. propionic acid (10%), for a duration of approx 10 min., in addition to the above-described cleaning process. The cleaning of both samples B and C took place in a continuous system, the cleaning of sample A in a batch mode.

Thereafter, all the samples A, B and C were polished in a continuous electropolishing system. The polishing took place using an acidic electrolyte, e.g. on a sulfuric acid-phosphoric acid-citric acid-basis in a preferred composition of 25-40% sulfuric acid, 50-70% phosphoric acid and 1-20% citric acid. The bath temperature was 40-50° C., the current density 15 A/dm². The electropolishing was performed over a period of approx. 1 min. The electropolishing was performed with the biaxially textured metal substrate arranged at a medium potential, without this being always necessary (concerning the arrangement of the electropolishing cell see FIG. 5). Here, the electrolysis current was supplied to the tape over the entire rear side of the tape, so that the electropolishing cell was divided into two sub cells by the tape.

After this treatment, all the samples A, B and C exhibited a roughness of rmn≦10 nm (measurement by way of atomic force microscopy AFM, measuring area 10×10 μm).

EBSD analyses of these samples corresponded to those before polishing, concerning the indexing rate of the metal substrate surface.

On all of the samples A, B and C a standard coating was performed as described above, and on none of the samples could an oriented lanthane zirconate buffer layer be obtained.

According to a further variant, the samples A, B and C, which had been subjected to electropolishing as described above, were subjected to a repeated annealing treatment. The annealing was performed at 1000° C. in the presence of a reducing atmosphere, e.g. 100% hydrogen. Sample A was annealed in a laboratory batch furnace. The annealing was performed at a heat-up time of one hour and a cooling time of two hours, without dwell time, at 1000° C. The samples B and C were annealed in a continuous annealing system, also in the presence of a reducing atmosphere, e.g. 100% hydrogen. The dwell time at the maximum temperature was approx 1-5 min. The maximum temperature amounted to between 850-1100° C. In this temperature range comparable results for different samples were obtained.

All the samples A, B and C were coated with a buffer coating under the above-described unchanged standard conditions. A crystalline and oriented buffer layer of lanthane zirconate could now be observed on all the samples. The X-ray diffraction pattern is shown in FIG. 3, Curve 1. The difference over Curve 2 is striking. The desired epitaxial growth of the lanthane zirconate layer can be seen from the disappearance of the texture defect peak at 28.6° 2θ. The level of the [222] reflex at 28.6° θ2 is a direct measure of the quality of the texture transfer. Ideally, on the [004] reflex at 33.2° θ2 shall be detectable. The EBSD analyses substantially corresponded to those of the metal substrate, and a minor deterioration of the values of <5% was noticed, as usual for chemical coating processes.

RHEED measurements of the metal substrates after the repeated annealing treatments showed—in contrast to electropolished samples without such an annealing treatment—a re-crystallization of the uppermost atomic layers of the metal substrate.

It was possible to deposit one or more additional buffer layers on the buffer layers of the samples A, B and C produced according to the invention, wherein the material of each of the additionally deposited buffer layer(s) can independently be the same buffer layer material as that of the first buffer layer deposited according to the invention or a different material. Directly on the buffer layer deposited according to the invention or on an additional deposited buffer layer, a high-temperature superconductor layer can be deposited, for example from an YBCO material or a different ceramic high-temperature superconductor material, as for example a BiCaSr—HTS-material. The invention comprises the further coating arrangements produced in this manner.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A method for producing a biaxially textured metal substrate having a metal surface, wherein the substrate is modified in order to produce a high-temperature superconductor (HTS) coating arrangement and wherein the metal surface is modified in order to deposit a layer of the high-temperature superconductor coating arrangement epitaxially thereon, the method comprising:
producing a biaxially textured metal substrate;
subjecting the textured metal substrate surface to a polishing treatment; and
subjecting the surface-polished metal substrate to a post-annealing treatment before performing a subsequent selective coating comprising epitaxial deposition of a layer of the HTS coating arrangement, wherein the post-annealing treatment is carried out at a temperature of greater than or equal to 850° C.

2. The method according to claim 1, wherein the polishing treatment is performed as an electropolishing treatment.

3. The method according to claim 2, wherein the electropolishing treatment is performed with the metal substrate to be polished arranged at a medium potential.

4. The method according to claim 2, wherein the electropolishing treatment is performed at a current density of 2 to 80 A/dm².

5. The method according to claim 2, wherein prior to polishing, a surface etching treatment is performed using organic acids.

6. The method according to claim 2, wherein the electropolishing treatment of a respective surface segment is performed over a period of ≦15 min.

7. The method according to claim 1, wherein the polishing treatment is performed up to a surface roughness of rms ≦15 nm.

8. The method according to claim 1, wherein the post-annealing treatment is performed at a suitable temperature and over a sufficient period such that a re-crystallization of the metal substrate surface takes place.

9. The method according to claim 1, wherein the post-annealing treatment takes place for a period of ≦15 min., related to a respective surface segment.

10. The method according to claim 1, wherein the post-annealing treatment is performed in a reducing atmosphere.

11. The method according to claim 1, wherein the post-annealing treatment is performed in such a manner that the post-annealed surface analyzed by RHEED is at least partially crystalline.

12. The method according to claim 1, wherein the substrate comprises a nickel and/or copper-base alloy.

13. A method for producing a high-temperature superconductor (HTS) coating arrangement or a precursor coating arrangement thereof not comprising an HTS layer, the method comprising producing a biaxially textured metal substrate by the method according to claim 1, and epitaxially depositing a buffer layer and/or another intermediate layer and/or an HTS layer, respectively directly or indirectly, on the biaxially textured metal substrate.

14. The method according to claim 13, wherein the buffer layer and/or intermediate layer and/or HTS layer are deposited by chemical solution deposition.

15. The method according to claim 13, wherein the buffer layer is deposited on the metal substrate epitaxially and grows on the metal substrate which, crystallographically, is arranged rotated with respect to the metal substrate.

16. A biaxially textured metal substrate or coating arrangement produced by the method according to claim 1.

17. A method for producing a biaxially textured metal substrate having a metal surface, wherein the substrate is modified in order to produce a high-temperature superconductor (HTS) coating arrangement and wherein the metal surface is modified in order to deposit a layer of the high-temperature superconductor coating arrangement epitaxially thereon, the method comprising:
producing a biaxially textured metal substrate;
subjecting the textured metal substrate surface to an electropolishing treatment; and
subjecting the surface-polished metal substrate to a post-annealing treatment before performing a subsequent selective coating comprising epitaxial deposition of a layer of the HTS coating arrangement, wherein the post-annealing treatment is carried out at a temperature of greater than or equal to 850° C.

18. The method according to claim 17, wherein the polishing treatment is performed up to a surface roughness of rms $\leq$15 nm.

19. The method according to claim 18, wherein the electropolishing treatment is performed at a current density of 5 to 50 A/dm$^2$.

20. The method according to claim 18, wherein the post-annealing treatment is performed in such a manner that the post-annealed surface analyzed by RHEED is at least partially crystalline.

* * * * *